United States Patent
Lyons

[19]

[11] Patent Number: 5,936,968
[45] Date of Patent: Aug. 10, 1999

[54] METHOD AND APPARATUS FOR MULTIPLEXING COMPLETE MPEG TRANSPORT STREAMS FROM MULTIPLE SOURCES USING A PLL COUPLED TO BOTH THE PCR AND THE TRANSPORT ENCODER CLOCK

[75] Inventor: Paul W. Lyons, New Egypt, N.J.

[73] Assignee: Sarnoff Corporation, Princeton, N.J.

[21] Appl. No.: 08/864,324

[22] Filed: May 28, 1997

[51] Int. Cl.⁶ .................................. H04J 3/06; H03C 7/00
[52] U.S. Cl. ........................ 370/503; 370/516; 375/376; 331/2
[58] Field of Search .................................. 370/503, 506, 370/509, 508, 516; 375/371, 373, 376; 331/2, 18, 20; 395/556, 555, 559; 348/423

[56] References Cited

U.S. PATENT DOCUMENTS

| | | | |
|---|---|---|---|
| 5,245,634 | 9/1993 | Averbuch | 375/108 |
| 5,371,547 | 12/1994 | Siracusa et al. | 348/426 |
| 5,559,808 | 9/1996 | Kostreski et al. | 370/108 |
| 5,666,330 | 9/1997 | Zampetti | 368/47 |
| 5,722,081 | 2/1998 | Tamura | 455/502 |
| 5,727,034 | 3/1998 | Ojaniemi | 375/356 |
| 5,757,786 | 5/1998 | Joo | 370/324 |
| 5,767,746 | 6/1998 | Dieterich | 331/17 |
| 5,783,972 | 6/1998 | Nishikawa | 331/17 |
| 5,784,119 | 7/1998 | Noda et al. | 348/512 |
| 5,828,414 | 10/1998 | Perkins et al. | 348/423 |

OTHER PUBLICATIONS

Proposed SMPTE Standard for Television—10–Bit 4:2:2 Component and 4fsc Composite Digital Signals—Serial Digital Interface, SMPTE 259M, SMPTE Journal, Aug. 1995, pp. 562–565.

ATSC Digital Television Standard, Doc. A/53, Sep. 16, 1995.

Primary Examiner—Douglas W. Olms
Assistant Examiner—David R Vincent
Attorney, Agent, or Firm—William J. Burke

[57] ABSTRACT

A method and apparatus for splicing transport streams from multiple sources without violating the clock slew rates specified for a receiver. The method employs a digital phase lock loop (PLL) to lock both the transport output clock of the digital studio and the transmission symbol clock to a stable reference clock of 27 MHz.

20 Claims, 4 Drawing Sheets

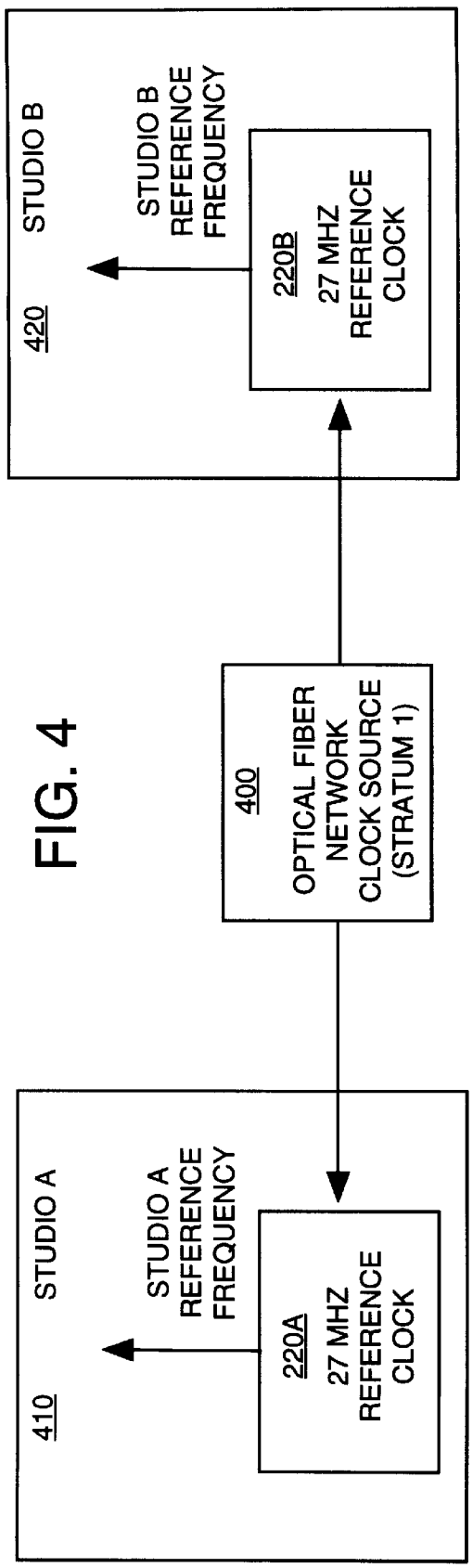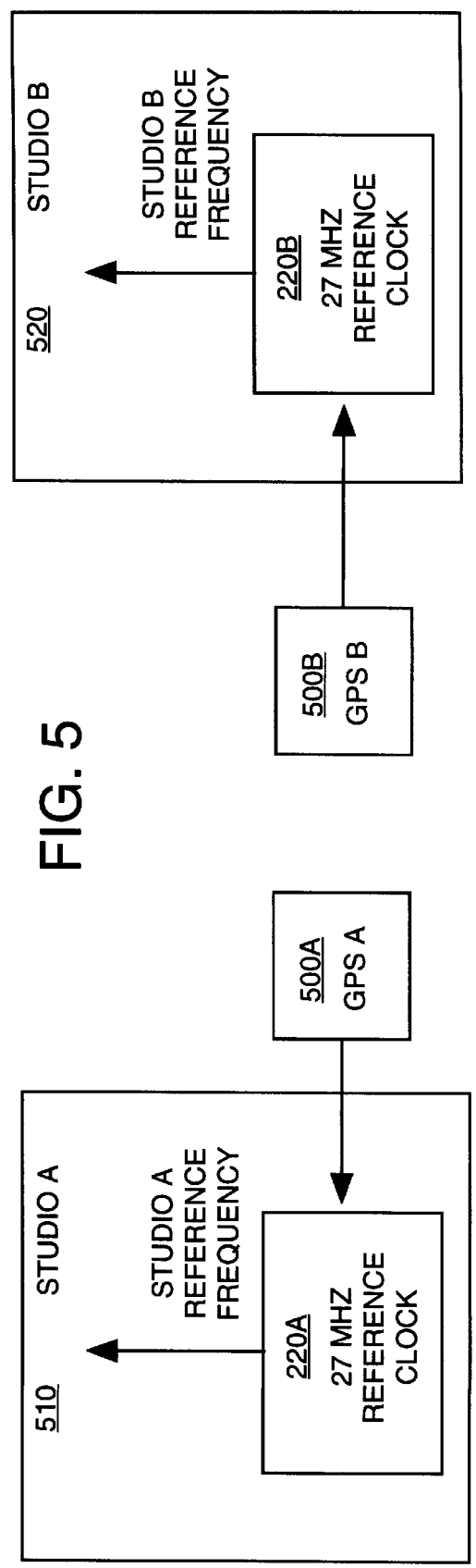

METHOD AND APPARATUS FOR MULTIPLEXING COMPLETE MPEG TRANSPORT STREAMS FROM MULTIPLE SOURCES USING A PLL COUPLED TO BOTH THE PCR AND THE TRANSPORT ENCODER CLOCK

This invention was made with U.S. government support under contract number 70NANB5H1174. The U.S. government has certain rights in this invention.

The present invention relates to an apparatus and concomitant method for splicing transport streams from multiple sources without violating the clock slew rates specified for a receiver. More particularly, this invention relates to a method and apparatus that splices transport streams together while locking both the transport output clock and the transmission symbol clock to a reference clock.

BACKGROUND OF THE INVENTION

The proliferation of digital information has created a new television industry employing the concept of a "digital studio", e.g., the HDTV (High Definition Television) or SDTV (Standard Definition television) broadcast studio. A digital studio is an environment or system having numerous components where various sources of digital information can be selectively accessed, manipulated and delivered (in real time or in delay mode) to multiple clients.

Currently, a digital studio is required to produce an output data stream that meets the specifications set forth in the ATSC (Advanced Television Systems Committee) Digital Television Standard and the MPEG-2 systems level standards as set forth in ISO/IEC 13818-1 recommendation H.222.0. The digital studio is required to dynamically switch between various program sources and to produce a compliant output stream. Program sources include, but are not limited to, file servers, tape players, encoders, satellite links, networks and other sources, where these sources may contain either pre-recorded or "live" data streams. The digital studio may incorporate a switcher, e.g., a Play-To-Air Switcher, to switch or splice the various data streams into a single output stream.

However, transport streams that serve as inputs to the Play-to-Air Switcher are generally plesiochronous (not sourced from the same clock but are nominally at the same frequency with a defined precision), since these input transport streams are from a variety of sources and are likely created or recorded at different times. In other words, the timing information (byte rate and Program Clock Reference as discussed below) of each input transport stream is determined by the clocks used at the time of the recording, which may vary depending upon the local conditions that prevail at that time. For example, MPEG defines timing information in terms of time stamps or clock references, e.g., "System Clock Reference" (SCR) and "Program Clock Reference" (PCR), which indicate the time of a specific action such as the arrival of a byte or the presentation of a presentation unit, e.g., a decoded picture or a decoded audio frame.

Currently, the output stream is required to contain a PCR that has a frequency tolerance of 30 ppm and a rate of change specification of less than or equal to $75 \times 10^{-3}$ Hz/sec. This requirement permits the PCR to change one cycle in frequency over 13⅓ seconds. The MPEG specification further notes that "sources of coded data should follow a tighter tolerance in order to facilitate compliant operation of consumer recorders and playback equipment." (ISO/IEC 13818-1 §2.4.2.1)

The diversity in the timing information of the various input transport streams creates a difficult dilemma for the digital studio. The digital studio may adjust its clock to accommodate the timing of a particular input transport stream. For example, if a particular input transport stream is clocked from the storage device (e.g., a server) using a clock that is lower in frequency than the clock used to record the stream, the digital studio can compensate for the lower output rate by maintaining a PCR at a comparable lower rate in its output transport stream. Unfortunately, switching from one input transport stream to another presents the problem of matching the clock rates without violating the PCR slew rate specification. Namely, changing the clock rate too rapidly may cause the clock located on the receiver (possibly including the transmitter for the digital studio) to lose frequency lock, thereby resulting in the loss of pictures or sudden shifting or "jerking" in the presentation of video data and/or similar detrimental effects in the presentation of audio data.

Furthermore, ATSC Standard (Doc. A/53, Sep. 16, 1995) specifically states that the clock frequencies between the source coding domain and the channel coding domain operate asynchronously and are not required to be frequency-locked to each other. The ATSC Standard indicates that frequency drift can be addressed through the occasional insertion or deletion of a NULL packet from the transport stream. However, such NULL packet insertion/deletion reduces the transmission efficiency of the digital studio.

Therefore, a need exists in the art for a method and apparatus for splicing transport streams from multiple sources without violating the clock slew rate specified for a receiver.

SUMMARY OF THE INVENTION

The present invention is a method and apparatus for splicing transport streams from multiple sources without violating the clock slew rates specified for a receiver. The method locks both the transport output clock of the digital studio and the transmission symbol clock to a stable reference clock.

More specifically, the present invention employs a digital phase lock loop circuit (PLL) to lock the transport output clock of the digital studio and the transmission symbol clock to the reference clock, where the reference clock, e.g., 27 MHz, is used to generate the PCR values. The reference clock is manipulated in accordance with a specific relationship, using frequency divider factors, to effect the locking of the various studio clocks.

BRIEF DESCRIPTION OF THE DRAWINGS

The teachings of the present invention can be readily understood by considering the following detailed description in conjunction with the accompanying drawings, in which:

FIG. 4 illustrates a block diagram of two digital studios that are locked to a Stratum-1 clock; and FIG. 5 illustrates a block diagram where two digital studios are locked to a global positioning system (GPS) timebase.

DETAILED DESCRIPTION

Figure 1:
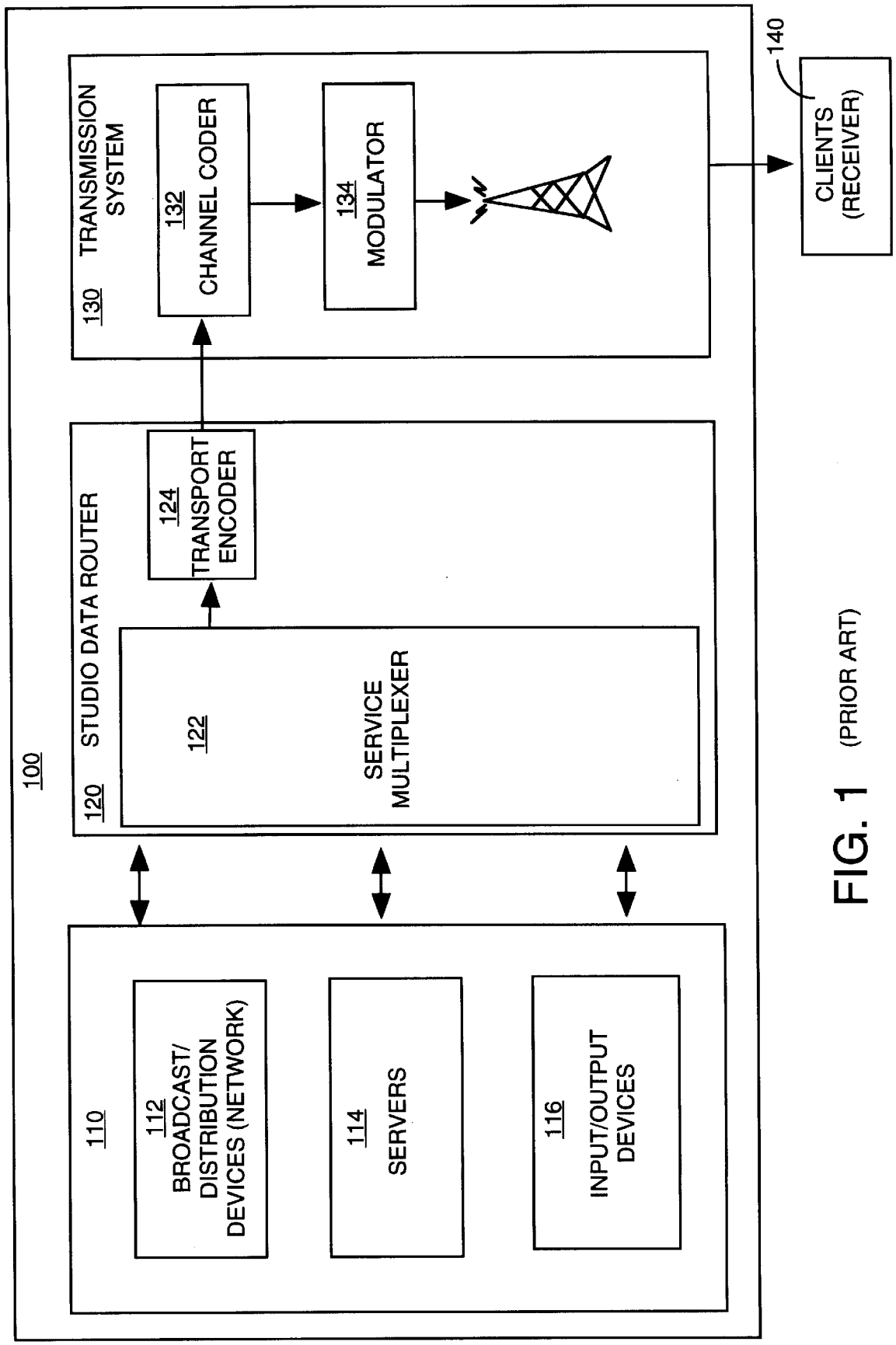
FIG. 1 illustrates a block diagram of a digital studio system.
Figure 2:
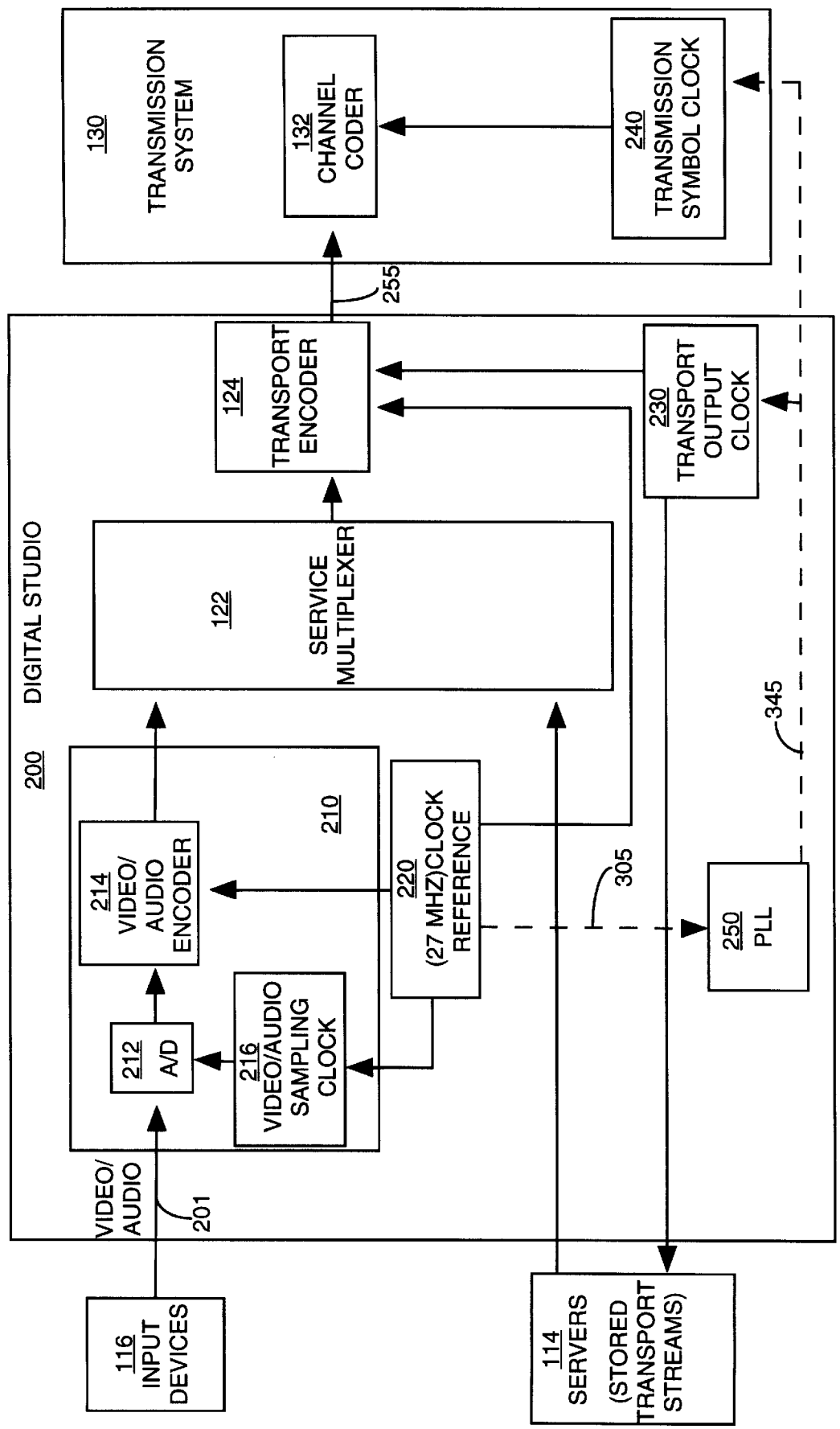
FIG. 2 illustrates a block diagram of a digital studio system employing the clock locking method of the present invention.

FIG. 1 illustrates a block diagram of a digital studio 100 comprising a source section 110, a studio data router 120, and a transmission system 130. Alternatively, those skilled in the art will realize that the digital studio may simply comprise only the studio data router 120, where the source section 110 (or portion thereof) and the transmission system 130 are implemented as separate systems as illustrated in FIG. 2.

Generally, the digital studio serves to distribute various programs to a plurality of clients/receivers 140. In interactive mode, the digital studio 100 permits the clients 140 to selectively request and/or control the various studio resources within source section 110. Each of the clients may include, but is not limited to, a set-top terminal, a receiver, a computer or a storage device. In fact, since it is contemplated that the digital studio will be under distributed control, other studio components may serve as clients as well, e.g., the various program sources within source section 110.

Source section 110 comprises a plurality of program sources, e.g., broadcast/distributing devices 112, servers 114 and various input/output devices 116. More specifically, the broadcast/distribution devices or networks 112 may include, but are not limited to, a satellite distribution network, a broadcast network, a local "live-feed" network or even another digital studio. These devices may generate a transport stream that contains full-motion video, i.e., a sport event with a large quantity of motion and detail.

Although the present invention is described below with reference to transport streams, it should be understood that the present invention can be applied to other bitstream formats, including but not limited to, MPEG program streams or bitstreams in accordance with the asynchronous transfer mode (ATM). Furthermore, although the present invention is described below with reference to a digital studio, it should be understood that the present invention can be adapted to other devices, e.g., playback devices such as a receiver or a video player.

Similarly, the servers 114 may include, but are not limited to, file servers holding a plurality of film and video sources, e.g., a movie (24 frames/second), a video (30 frames/second) of a lecturer or a video of a commercial. In turn, the input/output devices 116 may include, but are not limited to, monitors, various filters, transcoders, converters, codecs, cameras, recorders, interface devices and switchers. Each of the various studio components may incorporate the necessary hardware (e.g., one or more processors, computers or workstation) to store or implement software routines or objects.

These various program sources generate and/or store transport streams (or data streams in general which are processed by the studio) that are received and multiplexed (splicing operation) by a service multiplexer 122 into a single bitstream, e.g., an output stream. This output stream is then encoded and packetized by a transport encoder 124, if not previously in transport format, to produce an output transport stream.

Finally, the output transport stream is forwarded to a channel coder 132, where error correction coding is applied. The modulator 134 then modulates the error-coded output transport stream onto a carrier signal, using one of many possible modulation schemes, e.g., 8-vestigial sideband modulation (VSB), 16-VSB, Quadrature Amplitude Modulation (QAM) and the like.

As discussed above, the significant differences in the timing information embedded in the various transport streams pose a significant challenge in formulating a single multiplexed (spliced) output transport stream. FIG. 2 illustrates a block diagram of a digital studio 200 of the present invention that addresses this timing criticality by incorporating a digital PLL to lock a transmission symbol clock 240 and a transport output clock 230 with a reference clock 220, e.g., having a 27 MHz frequency.

More specifically, FIG. 2 illustrates various clocks that are employed in the digital studio in relation to various studio components/devices. An important feature of the digital studio 200 is the presence of a highly accurate reference clock 220. The digital studio 200 maintains and distributes this reference clock, illustratively set at accurate and stable 27 MHz, to all other clocks in the digital studio.

Although the preferred embodiment of the present invention uses a 27 MHz reference frequency, other implementations of the invention may use other reference frequencies. In such cases, the frequency divider factors as discussed below in Table 1 must be changed accordingly.

In the preferred embodiment, the frequency tolerance of the reference clock should be better than specified by the MPEG standard, e.g., better than 1 ppm. More importantly, a PLL 250 allows the transport output clock 230 and the transmission symbol clock 240 to lock to the reference clock 220. The significant benefits of such a locking method are to permit synchronization of playback streams (e.g., transport streams read from a server 114) with the studio reference clock, and to realize a simple feed forward arrangement between the studio 200 and the transmission system 130.

Returning to FIG. 2, the digital studio 200 may incorporate an encoding section 210 to generate or convert various input signals into MPEG compliant elementary streams. For example, one or more of the input devices 116 forward "raw" input signals such as analog video and audio signals from a camera to the studio 200 via path 201. The input signals are sampled and converted by an analog-to-digital (A/D) converter 212 into a digitized signal. The sampling frequency for the A/D is provided by the video/audio sampling clock 216, which, in turn, is frequency locked to the reference clock 220. The digitized signal is then encoded by video/audio encoder 214, to implement various video and audio compression methods, i.e., source encoding. The encoded signal is then passed through a service multiplexer 122, where the encoded signal is converted by a transport encoder 124 into an "output" transport stream.

An MPEG compliant transport stream comprises a plurality of packets with each packet having a length of 188 bytes, 4 bytes of header and 184 bytes of payload. The PCR fields are carried in the adaptation field that follows the 4-byte transport packet header. The value encoded in the PCR field indicates the time t(i), where i refers to the byte containing the last bit of the PCR base field. The PCR values are derived from the 27 MHz reference clock 220 and are inserted into the transport stream by the transport encoder 124. The PCR also serves as the basis for the generation of the presentation time stamp (PTS) and the decoding time stamp (DTS), that represent the presentation and decoding time of audio and video signals, respectively.

The relationship between PCR and the PTS/DTS is generally defined for each transport stream at the time of creation of the stream. However, these timing information contain differences when compared to other PCR and PTS/DTS in other transport streams stored within server 114, or when compared to the timing of "real" time encoding of the encoding section 210 as illustrated in the digital studio. This timing discrepancy between multiple input transport streams causes the digital studio to adjust its clock as the studio attempts to splice different transport streams into a single output transport stream.

To illustrate, the transport output clock 230 is used to clock a particular transport stream from the server 114. If the digital studio detects a frequency, represented by the PCR values in the transport stream from the server, to be different from the clock frequency of the transport output clock 230 in the digital studio, then the digital studio will adjust the PCR values in the resulting output transport stream on path 255 to a comparable rate.

Since it is unpredictable as to which programs and when the programs are requested by the clients, a situation may develop where the studio must splice different transport streams with significant time offsets. For example, the reference frequency at the time of recording for one transport stream may be at one end of the frequency tolerance, e.g., −30 ppm, while the reference frequency at the time of recording for a second transport stream may be at the other end of the frequency tolerance, e.g., +30 ppm. Thus, as the studio switches between these two transport streams retrieved from the server, the resulting output transport stream may contain timing offsets of 60 ppm. Such variant adjustments of the studio clock to compensate for such anomalous timing offset creates the possibility of violating the PCR slew rates of the receiver and/or transmitter.

First, since ATSC requires the transport output clock 230 to be frequency locked with the transmission symbol clock 240, the transmission symbol clock 240 must also adjust its timing in response to changes in the transport output clock to match the rate at which data is generated and transmitted, i.e., locked to the transport output clock 230. Second, in turn, the receiver will apply the received PCR values to adjust its clock, e.g., a decoder clock (not shown) to synchronize the decoding process with the encoding process to avoid input data buffer overflow and underflow conditions. Thus, the transport stream splicing process causes a cascade of clock adjustments along the entire path traveled by the transport stream, from the program source to the client. In fact, since it is contemplated that digital studio may receive a transport stream from other broadcast/distribution networks, it is quite possible that a transport stream may traverse over numerous networks prior to reaching its destination.

Figure 3:
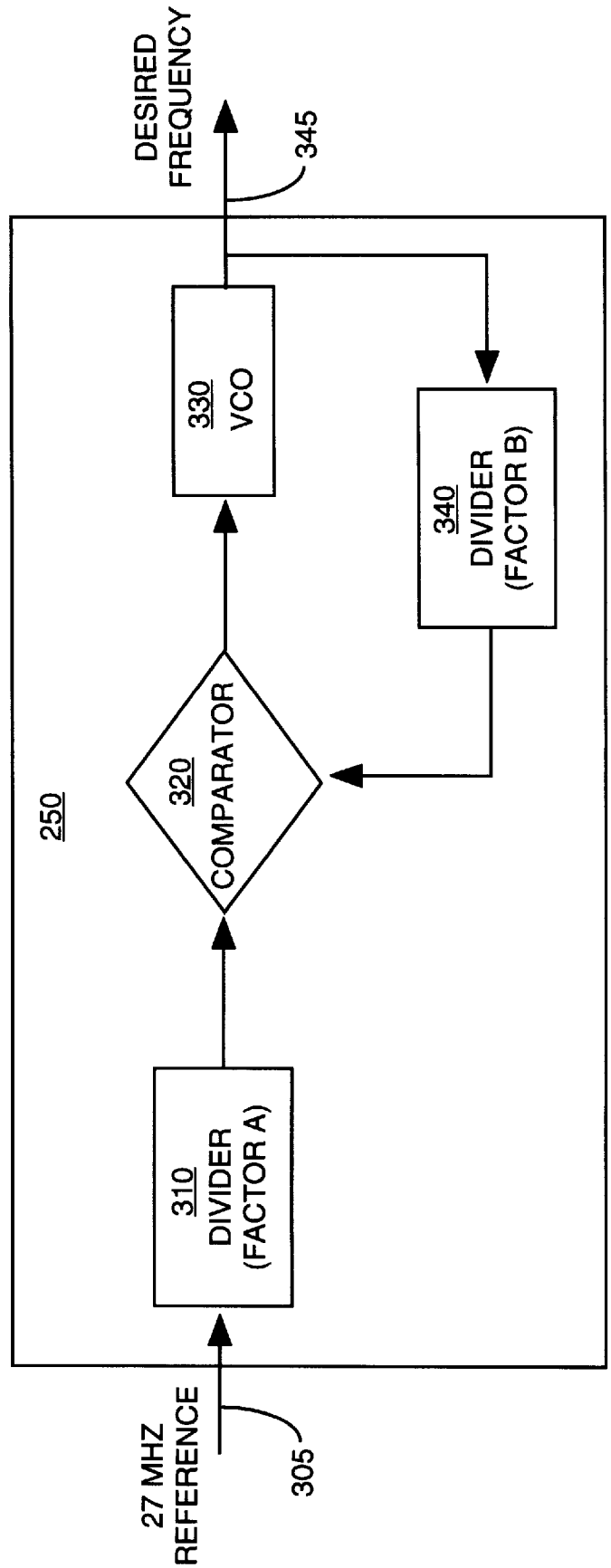
FIG. 3 illustrates a block diagram of a PLL for implementing the present clock locking method.

FIG. 3 illustrates a block diagram of the PLL 250 used by the digital studio 200 to lock both the transport output clock 230 and the transmission symbol clock 240 to the reference clock 220. The PLL is a digital circuit that compares the frequency of an input signal to the frequency of the output signal and causes a Voltage-Controlled Oscillator (VCO), e.g., a Voltage-Controlled Crystal Oscillator (VCXO), to lock its output signal frequency to that of the input signal to effect synchronization.

More specifically, in the present invention, PLL 250 comprises two dividers (frequency dividers) 310 and 340, a comparator 320 and a voltage controlled oscillator 330. The PLL receives an input reference signal of 27 MHz from the reference clock 220 via path 305. The 27 MHz input reference signal is divided (counted down) by divider 310 using a factor (divisor) "A" that relates the 27 MHz frequency to an output frequency desired frequency) of the PLL on path 345. The desired frequency is divided (counted down) to the same comparison frequency by divider 340 using a second factor (divisor) "B". The comparator 320 compares the two signals from the dividers and generates a frequency difference signal (control signal) that after filtering (not shown) is used as a control voltage for the VCO 330 that produces the desired frequency.

The divider factors "A" and "B" are disclosed below in Table 1. These factors are premised on the fact that the frequency of the transmission symbol clock 240 is specified to be 10.76 MHz, or more specifically (4.5 MHz×684)/286. The transport output rate can be derived from this transmission symbol clock frequency. It is (4.5 MHz×684×188×312)/(286×832×313) or 2.424082307 Mbytes per second. The 312/313 factor is contributed from the fact that the transmission data frame, when using VSB modulation, carries two data fields. Each data field carries 313 segments with 312 data segments and one "Field Sync" segment that carries synchronization data. Each data segment consists of 832 symbols and carries the same amount of data as one transport packet, which accounts for the factor of 188, since each MPEG transport packet contains 188 bytes.

Table 1 shows the values (integer or subinteger relationships) for locking the 10.76 MHz transmission symbol clock, the ¾ symbol clock (8.07 MHz used in the Grand Alliance prototype system) and the basic transport output clock (2.4 MHz) to the 27 MHz reference. It should be noted that Table 1 contains "byte rate" values that can be converted to "bit rate" values using a multiplying factor of 8.

TABLE 1

|  | Desired Frequency | A | B | Comparison Frequency |
|---|---|---|---|---|
| Xmit-Symbol | 10762237.76 | 143 | 57 | 188811.19 |
| 3/4 Xmit-Symbol | 8071678.32 | 572 | 171 | 47202.80 |
| Transport Byte | 2424082.31 | 89518 | 8037 | 301.61 |

An important aspect of the present invention is the integer relationships that enable the locking of the transport output/transmission symbol clocks to the 27 MHz reference clock. During the recording process of a transport stream, a given number of 27 MHz clock cycles exists between a given number of transport bytes when the clocks are locked. For example, during the time period to record 171 transport packets, the number of 27 MHz reference clock cycles is always exactly 358072, when the transport output clock is locked to the 27 MHz reference. This fixed relationship is recorded into the transport stream and permits the automatic synchronization of the playback streams with the studio reference frequency, regardless of its current offset.

In other words, as the transport stream is recorded onto a playback device, e.g., a file server, the fixed relationship is established through the insertion of the timing stamps (PCR) for a particular number of bytes. Thus, although the frequency of the 27 MHz reference may have varied from the time of recording to the time of playback, the number of PCR counts given a particular number of bytes is still constant. This timing arrangement permits the digital studio 200 to automatically align the input transport stream from the server 114 with the studio's output transport stream, thereby providing a simple feed forward (no-feedback) timing arrangement. As the reference time base varies due to frequency tolerances, the playback byte clock (transport output clock 230) scales directly since it is also locked to the reference frequency.

Furthermore, although FIG. 2 illustrates a direct path for frequency locking the transmission symbol clock 240 with the reference clock 220 via the PLL 250, it is possible that the transmission system 130 is only connected to the digital studio 200 via an interface/link, e.g., path 255. In such a case, the transmission symbol clock 240 can be locked by solely determining the byte rate of the output transport stream on path 255 from the digital studio or by recovering the embedded PCR values in the transport stream itself. This again illustrates a simple feed forward (no-feedback) timing arrangement between the transport system (digital studio 200) and the transmission system 130. The present frequency locking method bypasses the need to incorporate a bi-directional data system, where the transmitter must pass and receive timing information to and from the digital studio prior to receiving the actual output transport stream.

Additionally, increased stability of the 27 MHz reference clock can be achieved by locking the reference clock 220 to other available clocks which are not related to the television industry. More specifically, the 27 MHz reference clock 220 of the digital studio can be locked to the network physical layer provided by an optical fiber network, e.g., the Synchronous Optical Network (SONET) provided by the common telephone carrier as illustrated in FIG. 4.

The components of a SONET network generally operate from a common primary reference clock (PRC, Stratum-1). The Stratum-1 clock has a stability requirement of $1 \times 10^{-11}$ as per CCITT-Rec. G.811 with respect to Universal Time Co-ordinated, which translates to a slippage of one SONET frame every 70 days on a T-1 line between synchronous islands, i.e., relative to another system operated with a second Stratum-1 clock. This high degree of stability, based upon atomic clocks, is available at most sites throughout the US via SONET connections provided by the telephone carriers.

FIG. 4 illustrates a block diagram where two digital studios 410 and 420 are locked to a Stratum-1 clock 400. More specifically, each studio incorporates a reference clock 220A and 220B that is frequency locked to the Stratum-1 clock 400. The reference clock in each respective studio is then able to provide a stable and highly accurate reference frequency throughout the entire studio. The SONET physical layers also have integer relationships to 27 MHz. SONET level (n) physical layer with a line rate of (51.84 MHz×n) has the integer relationship of 25/(16×9×n) to 27 MHz, where n is equal to multiples of basic 51.84 Mbits/s transport signal, i.e., n is from 1 to 48. However, this relationship does not consider any block code that may be employed. When block codes are used, then additional integer terms must be included.

Thus, signals received from remote sites, that are locked to Stratum-1 clocks, can be easily synchronized to studios that are locked to similar Stratum-1 clocks, e.g., one studio in New York and another in Los Angeles. Incoming transport streams need to be video frame synchronized to properly handle switching from source to source and must be "spliced" at points that properly address receiver buffer requirements as specified in the various specifications covering studio operation. Stability of this magnitude greatly simplifies the circuitry required to synchronize the incoming signal to the studio.

Alternatively, FIG. 5 illustrates a block diagram where two digital studios 510 and 520 are locked to a global positioning system (GPS) timebase. Since GPS is based on satellite ranging, highly accurate atomic clocks are deployed on the GPS satellites for synchronization of the satellites with terrestrial receivers. Thus, each studio incorporates a reference clock 220A and 220B which can be frequency locked to different GPS satellite clocks 500A and 500B, respectively. In this manner, signals received from remote sites can be easily synchronized to studios that are locked to similar GPS clocks, e.g., one studio in the US and another in Europe. In turn, the reference clock in each respective studio is then able to provide a stable and highly accurate reference frequency throughout the entire studio.

There has thus been shown and described a novel method and apparatus for splicing transport streams from multiple sources without violating the clock slew rates specified for a receiver. Many changes, modifications, variations and other uses and applications of the subject invention will, however, become apparent to those skilled in the art after considering this specification and the accompanying drawings which disclose the embodiments thereof. All such changes, modifications, variations and other uses and applications which do not depart from the spirit and scope of the invention are deemed to be covered by the invention, which is to be limited only by the claims which follow.

What is claimed is:

1. An apparatus for achieving time synchronization in a communication system, where said communication system performs a splicing operation where a plurality of data streams is multiplexed into an output stream, said apparatus comprising:
   a reference clock for providing a reference frequency for the communication system;
   a transport output clock for providing a frequency to control the splicing operation where a plurality of data streams is multiplexed into an output stream; and
   a Phase-Lock-Loop (PLL), coupled to said reference clock and said transport output clock, where said PLL locks said transport output clock to said reference clock.

2. The apparatus of claim 1, wherein said reference frequency is 27 MHz.

3. The apparatus of claim 1, wherein said PLL comprises:
   a first divider, for dividing said reference frequency with a first divisor;
   a voltage controlled oscillator (VCO) for generating a desired frequency;
   a second divider, coupled to said VCO, for dividing said desired frequency with a second divisor; and
   a comparator, coupled to said first divider, said second divider and said VCO, for generating a control signal for said VCO to produce said desired frequency.

4. The apparatus of claim 3, wherein said first and second divisors have the values 143 and 57 respectively to produce said desired frequency of approximately 10.76 MHz from said reference frequency having a frequency of 27 MHz.

5. The apparatus of claim 3, wherein said first and second divisors have the values 572 and 171 respectively to produce said desired frequency of approximately 8.07 MHz from said reference frequency having a frequency of 27 MHz.

6. The apparatus of claim 3, wherein said first and second divisors have the values 89518 and 8037 respectively to produce said desired frequency of approximately 2.4 MHz from said reference frequency having a frequency of 27 MHz.

7. The apparatus of claim 1, further comprising:
   a transmission symbol clock, coupled to said PLL, wherein said PLL locks both said transport output clock and said transmission symbol clock to said reference clock.

8. The apparatus of claim 1, wherein said reference clock is locked to a synchronous optical network (SONET) clock.

9. The apparatus of claim 1, wherein said reference clock is locked to a global positioning system (GPS) clock.

10. The apparatus of claim 1, wherein said communication system is a digital studio.

11. A method for achieving time synchronization in a communication system, where said communication system performs a splicing operation where a plurality of data streams is multiplexed into an output stream, said method comprising the steps of:

(a) providing a reference frequency for the communication system from a reference clock;

(b) providing a frequency to control the splicing operation from a transport output clock where a plurality of data streams is multiplexed into an output stream; and (c) locking said transport output clock to said reference clock using a phase lock loop (PLL).

12. The method of claim 11, wherein said PLL comprises:

a first divider, for dividing said reference frequency with a first divisor;

a voltage controlled oscillator (VCO) for generating a desired frequency;

a second divider, coupled to said VCO, for dividing said desired frequency with a second divisor; and a comparator, coupled to said first divider, said second divider and said VCO, for generating a control signal for said VCO to produce said desired frequency.

13. The method of claim 12, wherein said first and second divisors have the values 143 and 57 respectively to produce said desired frequency of approximately 10.76 MHz from said reference frequency having a frequency of 27 MHz.

14. The method of claim 12, wherein said first and second divisors have the values 572 and 171 respectively to produce said desired frequency of approximately 8.07 MHz from said reference frequency having a frequency of 27 MHz.

15. The method of claim 12, wherein said first and second divisors have the values 89518 and 8037 respectively to produce said desired frequency of approximately 2.4 MHz from said reference frequency having a frequency of 27 MHz.

16. The method of claim 11, wherein said locking step (c) further comprises the step of:

(c') locking a transmission symbol clock to said reference clock.

17. The method of claim 11, further comprising the step of:

(d) locking said reference clock to a synchronous optical network (SONET) clock.

18. The method of claim 11, further comprising the step of:

(d) locking said reference clock to a global positioning system (GPS) clock.

19. The method of claim 11, wherein said communication system is a digital studio.

20. A digital studio for multiplexing a plurality of data streams into an output stream, where one or more of said data streams may carry timing information that is different from a studio timing of said digital studio, said digital studio comprising:

a multiplexer for multiplexing the data streams into the output stream;

a reference clock having a reference frequency;

a transport output clock;

a transport encoder, coupled to said multiplexer, said reference clock and said transport output clock, for inserting the studio timing into the output stream in response to said reference clock and said transport output clock; and a Phase-Lock-Loop (PLL), coupled to said reference clock and said transport output clock, where said PLL locks said transport output clock to said reference clock.

* * * * *